Figure 1:
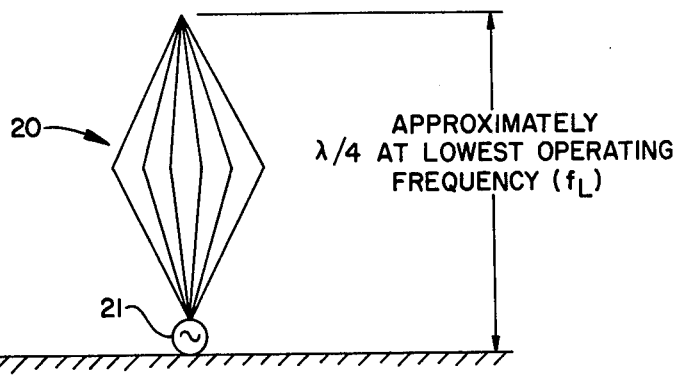

United States Patent [19]

Fenwick

[11] 4,145,693
[45] Mar. 20, 1979

[54] THREE BAND MONOPOLE ANTENNA

[75] Inventor: Richard C. Fenwick, Dallas, Tex.

[73] Assignee: Electrospace Systems, Inc., Richardson, Tex.

[21] Appl. No.: 778,510

[22] Filed: Mar. 17, 1977

[51] Int. Cl.² .................... H01Q 1/00; H01Q 9/00; H01Q 1/50

[52] U.S. Cl. .................... 343/722; 343/745; 343/850; 343/861

[58] Field of Search ........... 343/722, 745, 750, 850, 343/861

[56] References Cited

U.S. PATENT DOCUMENTS

| 2,118,429 | 5/1938 | Duttera | 343/750 |
| 2,440,081 | 4/1948 | Fick | 343/745 |
| 3,775,707 | 11/1973 | Frazier | 343/745 |
| 3,909,830 | 9/1975 | Campbell | 343/745 |

OTHER PUBLICATIONS

The A.R.R.L. Antenna Book, The American Radio Relay League, Newington, Connecticut, 1970, pp. 195-196.

Primary Examiner—Alfred E. Smith
Assistant Examiner—Harry E. Barlow
Attorney, Agent, or Firm—Warren H. Kintzinger

[57] ABSTRACT

A three band monopole antenna with such length as to be of greater electrical length than a quarter wavelength of the two highest frequency bands and shorter than a quarter wavelength of the lowest frequency band. The antenna system includes a matching network at its base matching the antenna on three frequency bands related by, substantially, the progression 1, 2, 4, and with the matching network including a shunt inductor and an inductor and capacitor in series with the signal feedpoint.

5 Claims, 10 Drawing Figures

U.S. Patent  Mar. 20, 1979  Sheet 1 of 4  4,145,693

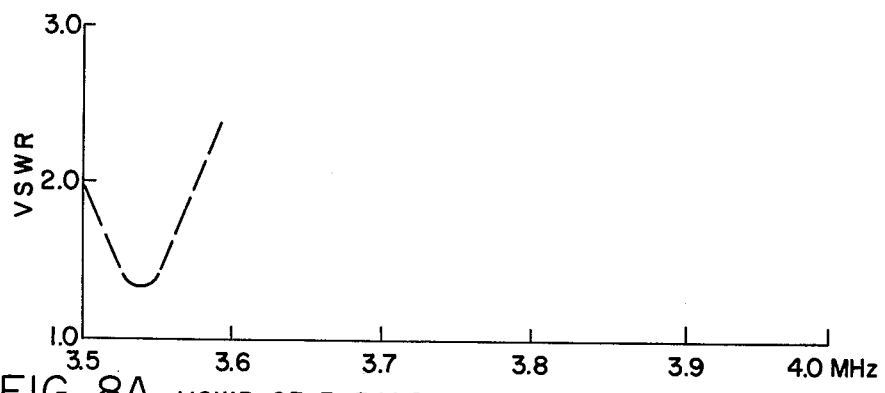
FIG. 8A  VSWR OF 3 BAND ANTENNA
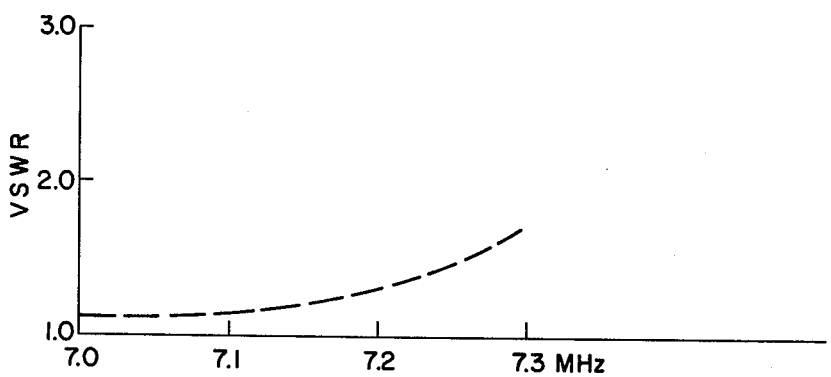
FIG. 8B  VSWR OF 3 BAND ANTENNA
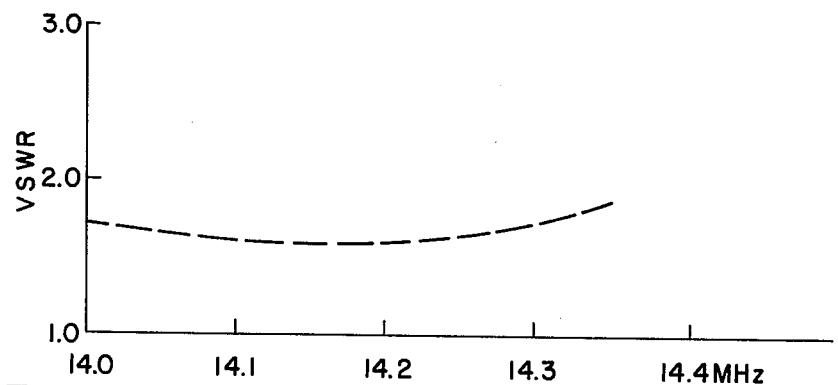
FIG. 8C  VSWR OF 3 BAND ANTENNA ns
THREE BAND MONOPOLE ANTENNA This invention relates in general to multi-band monopole antennas, and in particular, to a monopole antenna of such length that as combined with a matching network at the antenna base the antenna is matched on three frequency bands related by the progression 1, 2, 4.

There are many monopole antenna applications in the high frequency (3–30MHz) band requiring an antenna that will operate at several harmonically related frequencies, for example 3.5, 7, and 14 MHz. Among the antenna structures and methods used to provide relatively simple antennas covering three bands are broadband monopoles, trap monopoles, parallel radiators, and three band matching networks for electrically short monopoles. Please note that pairs of these monopoles can be combined to form dipoles. The different antenna monopole structures set forth pose different problems and disadvantages with, for example, the broadband monopole being required to be nearly a quarter wave length tall at the lowest frequency and quite large in diameter. The trap and parallel antenna radiator approaches have relatively low radiation resistance on each band (typically twenty ohms or less), and when such low radiation resistance is put in series with typical ground system resistances, low efficiency results. In order for a conventional three band matching network to work the total length of the antenna must be less than a quarter wavelength at the highest frequency to be used so, as a result, efficiency and bandwidth and undesirably low at the lower frequencies.

It is therefore a principal object of this invention to provide a highly efficient three band antenna having increased gain and bandwidth.

Another object is to provide a monopole antenna with a matching network at the antenna base matching the antenna on three frequency bands related by the progression 1, 2, 4.

A further object in such a matching network is simultaneous adjustment of the antenna system on all three bands.

Still another object is to provide secondary adjustment of the relative resonant frequency of the highest frequency band and to a lesser degree relative resonant frequency of the lower two bands.

Features of this invention useful in accomplishing the above objects include in a three band monopole antenna, a bottom fed monopole antenna that is electrically longer than a quarter wavelength on the two higher frequency bands and electrically shorter than a quarter wavelength on the lowest frequency band. The antenna system includes a matching network with a shunt inductor to ground and an inductor and capacitor in series with the signal feedpoint. In some embodiments variable coils are used in the matching network for adjusting the tuning to favor portions of the bands with, for example, the shunt inductor coil adjustable to raise and lower the tuned frequency of the antenna system on all three bands simultaneously. Adjustment of the inductor coil in series with the capacitor and the signal feedpoint adjusts primarily the relative resonant frequency of the highest frequency band, and to a lesser degree the resonant frequency of the lower two bands to accomplish a moderate departure of the resonant frequencies on the three bands from a harmonic relationship. An alternate embodiment of the basic monopole antenna uses top loading with the top loading element at the top of the antenna having a diameter of substantially 0.01 the wavelength of the lowest frequency band signal.

Figure 2:
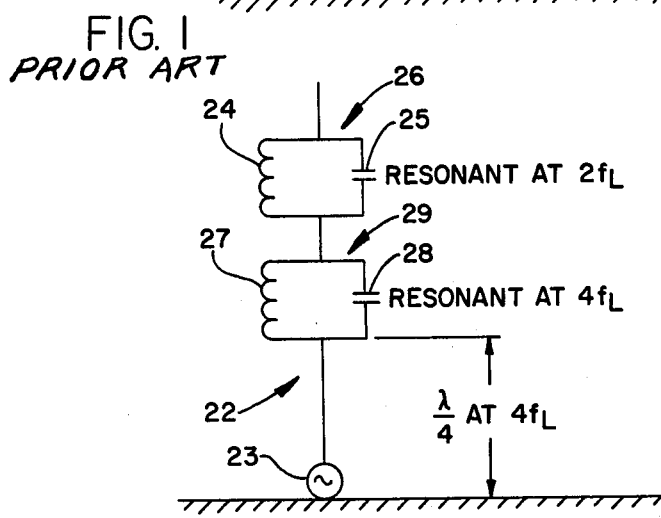
Figure 3:
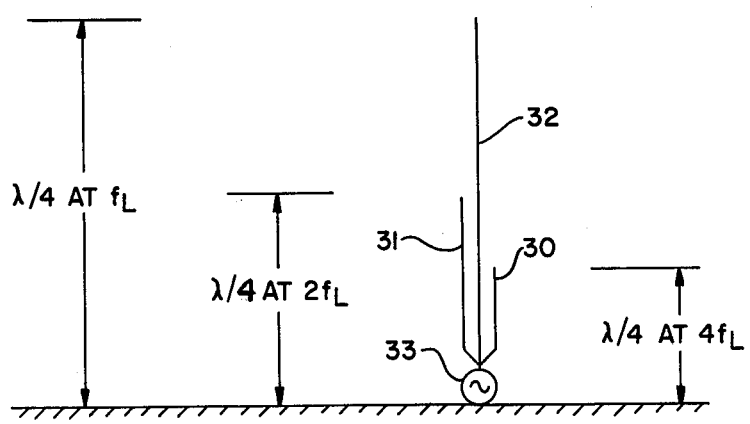
Figure 4:
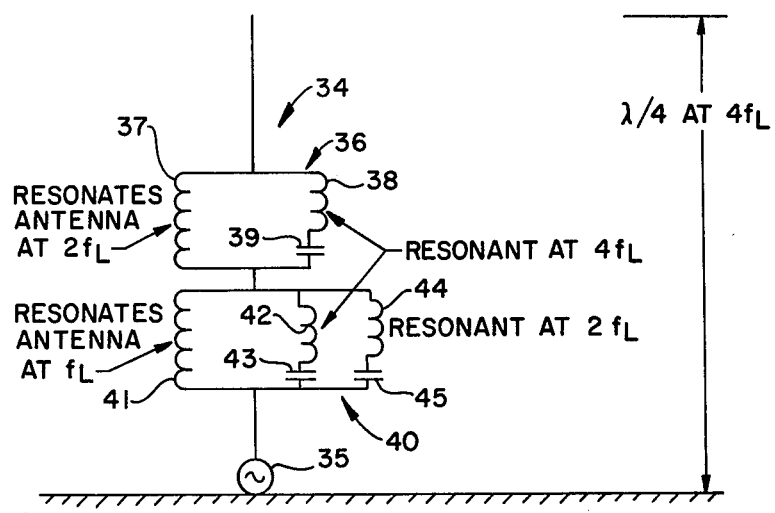
Figure 5:
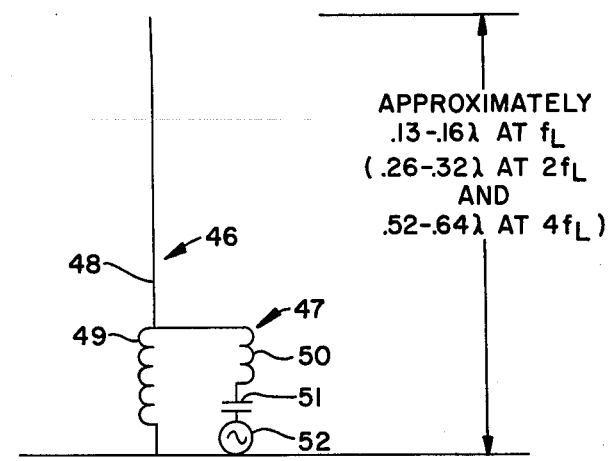
Figure 6:
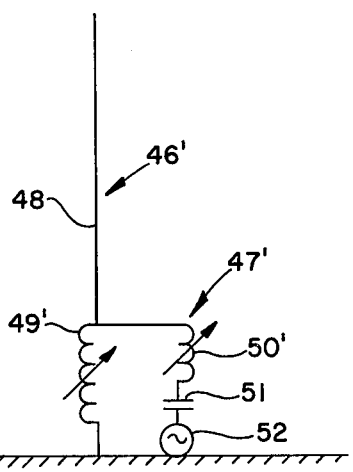
Figure 7:
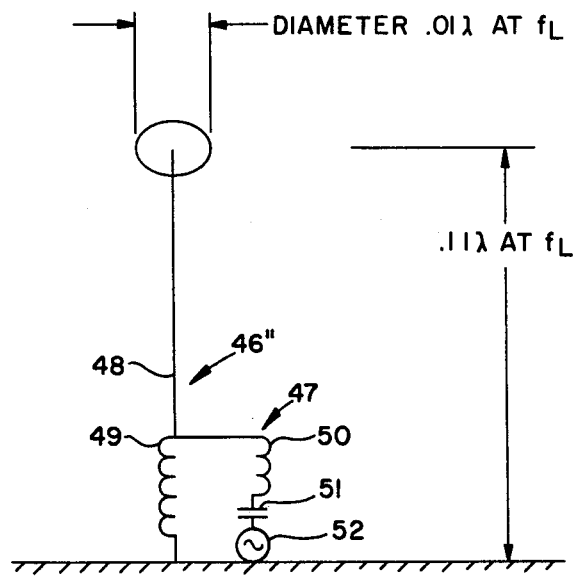

Specific embodiments representing what are presently regarded as the best modes of carrying out the invention are illustrated in the accompanying drawings:

In the drawings:

FIG. 1 represents a schematic of a prior art broadband monopole antenna;

FIG. 2, a schematic of a typical prior art three band trap monopole antenna;

FIG. 3, a schematic of a prior art three band monopole antenna system using parallel radiators;

FIG. 4, a schematic of a typical prior art monopole antenna using three band matching networks for electrically short monopoles;

FIG. 5, a schematic of my improved three band monopole antenna;

FIG. 6, a schematic of a three band monopole antenna with, in the antenna matching network, both a shunt inductor coil and an inductor coil in series with a capacitor and the antenna feedpoint being variable coils;

FIG. 7, a schematic of a three band monopole antenna like that of FIG. 5 equipped with a top loading element; and FIGS. 8A, 8B and 8C, VSWR curves for the three harmonically related frequencies of one of my high frequency (3–30 MHz) three band monopole antennas.

Referring to the drawings:

The prior art broadband monopole 20 of FIG. 1 equipped with bottom feed 21 is a relatively large and expensive structure that must be nearly a quarter wave length in height of the lowest frequency of several harmonically related frequencies and is a fat monopole relatively large in diameter at its vertical midpoint.

The three frequency prior art trap monopole 22 antenna, of FIG. 2, equipped with bottom feed 23 is resonant as an overall antenna at the lowest $f_L$ of the three harmonically related frequencies and includes a parallel inductor coil 24 and capacitor 25 making up subcircuit 26 which is resonant at $2f_L$ along with a parallel inductor coil 27 and capacitor 28 making up subcircuit 29 which is resonant at $4f_L$. This antenna structure results in relatively low radiation resistance on each band—typically twenty ohms or less that, when put in series with typical ground system resistances, results in low signal radiation efficiency.

Another antenna system having similar low signal radiation efficiency operational results is the prior art parallel radiators 30, 31 and 32 antenna system of FIG. 3 with a common bottom feed 33. Radiator 30 is one quarter wavelength at the highest frequency of four times the lowest frequency ($4f_L$), radiator 31 is one quarter wavelength at the mid frequency of two times the lowest frequency ($2f_L$), and radiator 32 is one quarter wavelength at the lowest frequency ($f_L$).

The three band matching networks equipped electrically short monopole antenna 34 of FIG. 4 also has low signal radiation efficiency operational results similar to those with the FIGS. 2 and 3 antennas. The antenna has a bottom feed 35 and has a matching network 36, with coil 37 in parallel with a coil 38 and capacitor 39 connected in series, series connected with matching network 40, having coil 41 in parallel with a coil 42 and capacitor 43 connected in series and also with another coil 44 and capacitor 45 connected in series. For this FIG. 4 prior art antenna to work, the total length of the antenna must be less than a quarter wavelength at the highest frequency to be used, meaning that at the lower frequencies the efficiency and bandwidth are undesirably low.

The improved three band antenna 46 of FIG. 5 has a length greater than a quarter wavelength on the highest two bands and a length in the approximate range of 0.13 to 0.16 wavelength of the lowest frequency band to thereby provide increased gain and bandwidth. The three frequency bands of the antenna 46 are related by the progression 1, 2, 4 and includes a matching network 47 at the base of the antenna radiating element 48 with a shunt inductor coil 49 to ground and an inductor coil 50 and capacitor 51 in series with feed source 52.

The three band antenna 46 of FIG. 6 is substantially the same as the embodiment of FIG. 5 except that inductor coils 49' and 50' are variable coils as the means of adjusting the tuning to favor portions of the bands. The coil 49' is adjustably varied to raise and lower the tuned frequency of the antenna system on all three bands simultaneously and has the greatest effect on the lowest discrete frequency band ($f_L$). Coil 50' is adjustably varied to adjust the relative resonant frequency of the highest frequency band, and has a lesser effect on the resonant frequency of the lower two bands. Thus, the resonant frequencies on the three bands can be made to depart moderately from a harmonic relationship.

The antenna system 46" of FIG. 7 is substantially the same as that of FIG. 5, with, however, a top loading conductive material disc 53 added at the top of radiating element 48. Adjustably variable coils such as coils 49' and 50' of the FIG. 6 embodiment could also be incorporated into the matching network 47 of the antenna system 46" for further tuning adjustment capabilities. For proper balanced operational design the top loading conductive material disc 53 is approximately 0.01 wavelength of the lowest band frequency ($f_L$).

The voltage standing wave ratio (VSWR) for the lower band of a three band monopole antenna such as the embodiments shown in FIGS. 5, 6 and 7 is shown in FIG. 8A. The VSWR for the mid range band is shown in FIG. 8B and VSWR for the high frequency band is shown in FIG. 8C.

With the embodiments of FIGS. 5 and 7 and within the range of adjustment of inductance coils 49' and 50' of the FIG. 6 embodiment typical nominal component reactances are coil 49 $\simeq$ 132 ohms at $f_L$, coil 50 $\simeq$ 69 ohms at $F_L$, and capacitor 51 $\simeq$ 454 ohms at $f_L$.

Whereas this invention is herein illustrated and described with respect to several embodiments hereof, it should be realized that various changes may be made without departing from essential contributions to the art made by the teachings hereof.

I claim:

1. In a three band monopole antenna comprising a radiating element and a base matching network: said base matching network comprising a shunt inductor coil interconnecting a voltage potential reference source and said radiating element and a series connection of an inductor coil, a capacitor and a signal source feedpoint; said series connector being electrically connected to said radiating element and said reference source wherein the electrical length of the antenna radiating structure is greater than a quarter wavelength on the two highest frequency bands and shorter than a quarter wavelength on the lowest frequency band with a length in the approximate range of 0.13 to 0.16 wavelength of the lowest frequency band; and the discrete operational frequency transmitter bands are narrow band and are are related in frequency by substantially the progression 1, 2, 4.

2. The three band monpole antenna of claim 1, wherein a top loading disc is mounted on the end of said radiating element remote from the signal source feedpoint.

3. The three band monopole antenna of claim 1, wherein said inductor coil means in series with said capacitive means is an adjustably variable coil for adjusting primarily the relative resonant frequency of the highest frequency band of the three bands for the antenna.

4. The three band monpole antenna of claim 1, wherein said shunt inductor coil is an adjustably variable coil for raising and lowering the tuned frequency of the antenna system on all three bands simultaneously with greatest adjusting effect on the lowest frequency band.

5. The three band monopole antenna of claim 4, wherein said inductor coil in series with said capacitor is an adjustably variable coil for adjusting primarily the relative resonant frequency of the highest frequency band of the three bands for the antenna.

* * * * *